(12) United States Patent
Matsuoka

(10) Patent No.: US 10,141,184 B2
(45) Date of Patent: Nov. 27, 2018

(54) METHOD OF PRODUCING SELF-SUPPORTING NITRIDE SEMICONDUCTOR SUBSTRATE

(71) Applicant: Tohoku University, Miyagi (JP)

(72) Inventor: Takashi Matsuoka, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 15/551,883

(22) PCT Filed: Jan. 22, 2016

(86) PCT No.: PCT/JP2016/051841
§ 371 (c)(1),
(2) Date: Aug. 17, 2017

(87) PCT Pub. No.: WO2016/132815
PCT Pub. Date: Aug. 25, 2016

(65) Prior Publication Data
US 2018/0068849 A1  Mar. 8, 2018

(30) Foreign Application Priority Data

Feb. 18, 2015 (JP) ................ 2015-029275

(51) Int. Cl.
*H01L 21/02* (2006.01)
*C23C 16/34* (2006.01)
(Continued)

(52) U.S. Cl.
CPC ...... *H01L 21/02389* (2013.01); *C23C 16/303* (2013.01); *C23C 16/34* (2013.01);
(Continued)

(58) Field of Classification Search
CPC ......... H01L 21/02458; H01L 21/02516; H01L 21/0254; H01L 21/02609
See application file for complete search history.

(56) References Cited

U.S. PATENT DOCUMENTS 6,413,627 B1 * 7/2002 Motoki ............... C30B 25/02
117/952
2006/0051554 A1  3/2006 Kumakura et al.
(Continued)

FOREIGN PATENT DOCUMENTS

JP   2003277196   10/2003
JP   2010087192   4/2010
(Continued)

OTHER PUBLICATIONS

International Search Report with English Language Translation, dated Mar. 8, 2016, Application No. PCT/JP2016/051841.

*Primary Examiner* — Jae Lee
(74) *Attorney, Agent, or Firm* — Womble Bond Dickinson (US) LLP

(57) ABSTRACT

Crystal growth of GaN is performed on a growth layer (103a) in a state in which the main surface is set to an N-polarity, thereby forming a boule (104) made of a GaN crystal. GaN is epitaxially grown using each growth island as a nucleus forming the growth layer (103a) by an MOVPE method using ammonia and trimethylgallium as source gases in accordance with a continuous process using an MOVPE apparatus used in the formation of a buffer layer (102).

4 Claims, 4 Drawing Sheets

(51) Int. Cl.
  *C30B 25/18* (2006.01)
  *H01L 33/32* (2010.01)
  *C30B 29/40* (2006.01)
  *H01L 29/20* (2006.01)
  *H01L 33/00* (2010.01)
  *C23C 16/30* (2006.01)

(52) U.S. Cl.
  CPC ............ *C30B 25/18* (2013.01); *C30B 25/183* (2013.01); *C30B 25/186* (2013.01); *C30B 29/406* (2013.01); *H01L 29/2003* (2013.01); *H01L 33/0075* (2013.01); *H01L 33/32* (2013.01); *H01L 21/0242* (2013.01); *H01L 21/0254* (2013.01); *H01L 21/0262* (2013.01); *H01L 21/02458* (2013.01); *H01L 21/02658* (2013.01)

(56) References Cited

U.S. PATENT DOCUMENTS

| | | | |
|---|---|---|---|
| 2010/0092800 A1* | 4/2010 | Itagaki | C30B 23/025 428/697 |
| 2011/0212603 A1* | 9/2011 | Arena | H01L 21/02458 438/478 |
| 2014/0065801 A1* | 3/2014 | Faurie | H01L 21/02389 438/478 |

FOREIGN PATENT DOCUMENTS

| | | |
|---|---|---|
| JP | 2010199441 | 9/2010 |
| WO | WO-2008060349 | 5/2008 |
| WO | WO-2014037446 | 3/2014 |

\* cited by examiner (a)  (b)

METHOD OF PRODUCING SELF-SUPPORTING NITRIDE SEMICONDUCTOR SUBSTRATE

TECHNICAL FIELD

The present invention relates to a method of producing a free-standing nitride semiconductor substrate made of the crystal of a nitride semiconductor such as GaN, AlN, InGaN, or InN.

BACKGROUND ART

In recent years, a group-III nitride semiconductor has received a great deal of attention as a semiconductor material used for a light-emitting device such as a light-emitting diode or a laser diode. Examples of the group-III nitride semiconductor are GaN and InGaN. This nitride semiconductor has a band gap energy corresponding to a wide wavelength range from infrared light to ultraviolet light and is a promising material as a light-emitting diode (LED) such as a blue or green LED and a semiconductor laser material whose oscillation wavelength ranges from the ultraviolet light to the infrared light. A white LED which is configured with a combination of a blue LED that consists of a nitride semiconductor and a yellow fluorescent material has been practiced as for the energy-saving lighting and widely commercially available. For example, a semiconductor laser which consists of a nitride semiconductor and wavelength of which is 400 to 410 nm has been used for read and write of a commercially available high-density DVD (Digital Versatile Disk).

In such a device, a thin film semiconductor with excellent crystallinity is indispensable. In general, a semiconductor device is constructed with semiconductor multi-layers formed on a single crystalline substrate. These semiconductor multi-layers are the same kind of materials as the substrate material. This structure makes it possible to grow high-quality single-crystalline thin films which is almost defect-free. Among the defects, a defect particularly noticeable is a dislocation. In an optical device, the dislocation density greatly influences the device characteristics such as the luminous efficiency and the device lifetime. For example, in a semiconductor laser diode constructed with InP and its related materials for the optical communications systems, the device lifetime of 100,000 hours which is the requirement from the system can be realized by suppressing the dislocation density less than $10^3/cm^2$ for the first time.

However, GaN as the main material of the nitride semiconductors has the equilibrium vapor pressure of nitrogen (N) between the gas phase and the solid phase is higher by several orders of magnitude than the equilibrium vapor pressures of conventionally used III-V semiconductor materials such as phosphorus (P) of InP. For this reason, it is difficult to fabricate a GaN wafer, and its cost is very high. Currently sapphire substrates have been used in commercially available white LEDs and blue traffic lights. A lattice mismatch between GaN and sapphire is 13.8%, and threading dislocations with the density of $10^{8-9}/cm^2$ exist in GaN. For this reason, the efficacy of the white LED is currently as low as 180 lm/w which is twice or more of the fluorescent light.

In an ultraviolet LED having a wavelength of 260 nm and expected as a sterilization lamp, the luminous efficiency is improved along with a decrease in dislocation density (see Non-Patent Literature 1). However, since a band gap difference between a light-emitting layer and a carrier injection layer (clad layer) cannot be increased due to the limitation of a band-gap energy unique to a material, the luminous efficiency almost reaches its limit.

Nitride semiconductors are expected to provide high-performance transistors due to the physical properties of nitride semiconductors. For a so-called lateral transistor such as a high electron mobility transistor (HEMT) in which carriers are travelled parallel to a substrate surface, the threading dislocation lowers the mobility of electrons. In a vertical transistor in which carriers are travelled perpendicular to a substrate surface, an operation at a high breakdown voltage and a high power is expected. Since the carriers are travelled parallel to the threading dislocation, the vertical transistor is influenced by the threading dislocation more than the lateral transistor.

In view of the above situations, one solution for a substrate is to use a GaN substrate. Currently, a GaN substrate called a "free-standing substrate" is commercially available. Its price is about 200,000 yen per 2-inch diameter. This substrate is produced through many steps including GaN growth on a single-crystal substrate such as GaAs or sapphire, substrate removal, GaN cutting, and polishing. As for an ultraviolet LED, the use of this free-standing GaN substrate can reduce the dislocation density in the LED structure and implements the improvement of the luminous efficiency by one or more orders of magnitude (see Non-Patent Literature 2).

RELATED ART LITERATURE

Non Patent Literature

Non-Patent Literature 1: H. Hirayama, H. Hirayama, S. Fujikawa, N. Noguchi, J. Norimatsu, T. Takano, K. Tsubaki, and N. Kamata, "222-282 nm AlGaN and InAlGaN-based deep-UV LEDs fabricated on high-quality AlN on sapphire", phys. stat. sol. (a), vol. 206, pp. 1176-1182, 2009.

Non-Patent Literature 2: K. Akita, T. Nakamura, and H. Hirayama, "Effects of GaN substrates on InAlGaN quaternary UV LEDs", phys. stat. sol. (a), vol. 201, pp. 2624-2627, 2004.

Non-Patent Literature 3: E. S. Hellman, "The Polarity of GaN: a Critical Review", MRS Internet J. Nitride Semicond. Res. vol. 3, pp. 11.1-11.11, 1998.

DISCLOSURE OF INVENTION

Problem to be Solved by the Invention

According to a current method, a free-standing GaN substrate is generally produced as follows. A sapphire substrate is used as a growth substrate, and the crystal growth of a GaN single-crystal thin film with the thickness of about 1 to 2 μm is performed using the metalorganic vapor phase epitaxy (MOVPE) method. After that, a thick GaN film is grown using halide vapor phase epitaxy (HVPE) which growth rate is by two orders of magnitude higher than that of the MOVPE method. The growth substrate is then removed to form an ingot-like GaN. This GaN is cut into substrates each having a desired thickness, thereby producing the free-standing GaN substrate. At present, the ingot-like GaN is grown with a Ga-polarity (group-III polarity). This polarity is a characteristic that is unique to wurtzite which is a hexagonal crystal structure as the GaN crystal structure. This polarity does not exist in a zincblende structure as the GaAs and InP cubic crystal structure conventionally used in practice.

The polarity will be described with reference to FIG. 5 below. FIG. 5 shows views for explaining the polarities when the crystal growth is performed along the c-axis direction of wurtzite. As shown in FIG. 5(a), when Ga(+C) polar growth is performed, one N atom is captured with one Ga atom. On the other hand, as shown in FIG. 5(b), for the N(–C) polar growth, one N atom is captured with three Ga atoms. In this manner, the N-polar growth can capture N atoms better than the Ga-polar growth. It is easily considered that the crystal growth situations depend on the polarity.

All the commercially available LEDs have been produced by Ga-polar growth. This is because Ga-polar growth is easier than N-polar growth (see Non-Patent Literature 3). The state of a substrate after growing GaN thick film for a free-standing GaN substrate produced by Ga-polar growth, will be described with reference to FIG. 6. To obtain a GaN substrate with a diameter of 2 inches, a sapphire substrate 601 with a diameter of 2.5 inches is used. The plane orientation of a side wall of a GaN film 602 grown is $\{1\bar{1}01\}$ or $\{1\bar{1}02\}$. As the film thickness of the GaN film 602 increases, the diameter thereof decreases. When the film thickness of the grown GaN film 602 reaches about 7 to 8 mm, the diameter of the uppermost surface is reduced to 2 inches, and the growth cannot be performed any longer. With this thickness, only six free-standing GaN substrates can be produced. For this reason, higher cost is required in producing a single free-standing substrate with the state-of-the-art production technique. As a result, the free-standing GaN substrate becomes expensive.

In a commercially available free-standing GaN substrate, the threading dislocation density generated in the interface between GaN and the substrate such as sapphire is $10^{8-9}/cm^2$ as described above. Along with an increase in thickness during the GaN boule growth, the dislocations annihilated each other by the distortion occurring in the crystal, thereby reducing the threading dislocation density. However, since GaN can be grown by only a thickness of about 7 to 8 mm, the threading dislocation density on the surface after the growth is $10^{5-6}/cm^2$.

The present invention has been made to solve the above problems, and an objective is to produce a free-standing nitride semiconductor substrate with a low threading dislocation density at lower cost.

Means of Solution to the Problem

According to the present invention, there is provided a method of producing a free-standing nitride semiconductor substrate, comprising a first step of forming a buffer layer of a nitride semiconductor that is one of GaN, AlN, InGaN, and InN on a main surface of a single crystalline substrate; a second step of forming a crystallized layer including a plurality of growth islands each of which is a hexagonal platelet with an N-polar upper surface, by annealing the buffer layer and thereby converting the buffer layer into a single crystal; a third step of fabricating a continuous layer including the growth islands by promoting the lateral growth of the islands along the main surface of the single crystalline substrate and thereby performing coalescence of the growth islands; a fourth step of forming a boule of the nitride semiconductor on the continuous layer by performing the crystal growth of the nitride semiconductor with an N-polar upper surface on the continuous layer; a fifth step of removing the single crystalline substrate from the boule; and a sixth step of fabricating a plurality of free-standing nitride semiconductor substrates by cutting the boule.

In the above method of producing the free-standing nitride semiconductor substrate, the growth substrate can be configulated with sapphire. In this case, the first step may include nitriding the main surface of the single crystalline substrate before forming the buffer layer, so that the crystal growth of the nitride semiconductor in the fourth step may be performed with an N-polar upper surface.

In the above method of producing the free-standing nitride semiconductor substrate, the single crystalline substrate may be made of a single-crystalline $ScAlMgO_4$. In this case, the first step may include nitriding the main surface of the single crystalline substrate before forming the buffer layer, so that the crystal growth of the nitride semiconductor in the fourth step may be performed with an N-polar upper surface. When the nitride semiconductor is one of GaN, InGaN, and InN, the fourth step may include steps of (a) forming an AlN layer on the continuous layer, (b) oxidizing a surface of the AlN layer, (c) nitriding the surface of the AlN layer which has been oxidized, and (d) performing crystal growth of the nitride semiconductor with an N-polar upper surface on the AlN layer. When the nitride semiconductor is AlN, the fourth step may include steps of (a) oxidizing a surface of the continuous layer, (b) nitriding the surface of the continuous layer that has been oxidized, and (c) performing crystal growth of the nitride semiconductor with an N-polar upper surface on the continuous layer. In addition, the main surface of the growth substrate is inclined by 0.4° to 1.2° from the c-plane. In particular, as for the inclination angle, the main surface of the single crystalline substrate is rotated by 0.4° to 1.2° around the m-axis thereof.

Effect of the Invention

As described above, according to the present invention, the crystal growth of the nitride semiconductor that includes GaN, AlN, InGaN, or InN is performed in a state in which the main surface is set to the N-polarity, thereby forming the single-crystalline boule of the nitride semiconductor. The free-standing nitride semiconductor substrate can be efficiently produced at lower cost.

EMBODIMENTS

The embodiments of the present invention will be described with reference to the accompanying drawings.

First Embodiment

Figure 1:
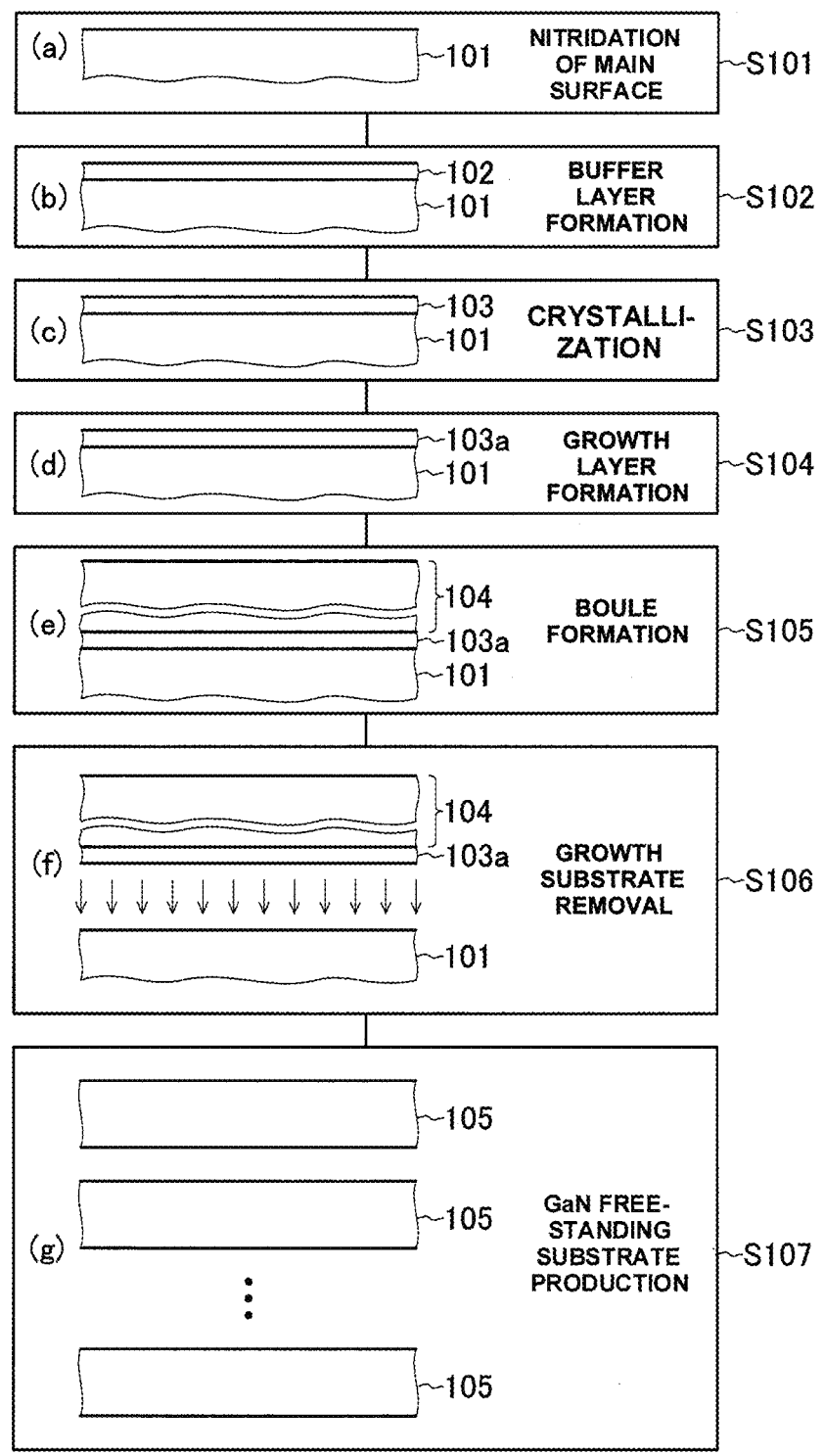
FIG. 1 shows views for explaining a method of producing a free-standing nitride semiconductor substrate according to the first embodiment of the present invention.

First of all, the first embodiment of the present invention will be described below. FIG. 1 shows views for explaining a method of producing a free-standing nitride semiconductor substrate according to the first embodiment of the present invention.

In the first step S101, as shown in FIG. 1(a), the main surface of a growth substrate, 101 made of a crystal is nitrided. The growth substrate, or the single crystalline substrate, 101 is, for example, made of sapphire. For example, the main surface can be nitrided in the growth reactor of a metalorganic vapor phase epitaxy (MOVPE) apparatus. First, the substrate 101 is loaded into the growth reactor and closed. Ammonia gas is supplied to the growth reactor, and the substrate 101 is heated to a temperature of 1,050° C. The flow rate of ammonia gas to be supplied is set to 5 standard liters/min (slm), and the pressure in the growth reactor is set to 86,659.3 Pa (650 Torr). The main surface is nitrided for 5 min under the above environment.

In the second step S102, as shown in FIG. 1(b), a buffer layer 102 made of GaN is then formed on the main surface of the nitrided growth substrate 101. The buffer layer 102 which is not single crystalline is formed at a low temperature of about 550° C. by the metalorganic vapor phase epitaxy (MOVPE) method using, for example, ammonia and trimethylgallium (TEG) as source materials. The buffer layer 102 is formed to a thickness of about 20 nm. For example, hydrogen is employed as the carrier gas for transporting the materials to the growth reactor, the flow rate of ammonia as the group-V material is set to 5 slm, a ratio (V/III ratio) of the supply amount of ammonia to the supply amount of TEG serving as the group-III material is set to 2,000, and the growth reactor pressure is set to 650 Torr. The growth time is set to 3 min.

In the third step S103, the buffer layer 102 is then heated and converted into a single crystal. As shown in FIG. 1(c), a crystallized layer 103 made of a plurality of growth islands each of which is a hexagonal platelet with an N-polar upper surface is formed. For example, the buffer layer is heated to a temperature of about 1,050° C. in the MOVPE reactor used in the formation of the buffer layer 102. For example, the growth reactor pressure is set to 650 Torr. Nitrogen gas and ammonia gas are supplied to the growth reactor, and the process time is set to 5 min. By this heating, some portion of the buffer layer 102 is evaporated (vaporized), and some other part is crystallized, thereby forming the plurality of growth islands each of which is a hexagonal platelet. Since the main surface of the growth substrate 101 has been nitrided, the upper surface of each growth island has the N-polarity.

In the fourth step S104, the growth is then promoted in a direction parallel to the plane of the growth substrate 101 to make the growth islands coalescent. As shown in FIG. 1(d), a continuous growth layer 103a is thus formed. Under the conditions that hydrogen is employed as the carrier gas for transporting the material to the growth reactor, the flow rate of ammonia is set to 5 slm, trimethylgallium (TMG) for producing Ga has a V/III ratio of 1,500, and the growth reactor pressure is set to 650 Torr. The growth time is set to 1 hour. The growth layer, or the continuous layer, 103a is formed to a thickness of about 1.7 μm. Since each growth island forming the crystallized film 103 has the N-polarity along the direction of the layer thickness, epitaxially grown GaN also has the N-polarity along the direction of the layer thickness, and the growth layer 103a is set to the N-polarity.

In the fifth step S105, as shown in FIG. 1(e), the crystal growth of GaN is performed on the growth layer 103a in a state in which the main surface is set to the N-polarity along the direction of the layer thickness, thereby forming a boule 104 made of the GaN crystal. The epitaxial growth of GaN is performed using each growth island as a nucleus forming the growth layer 103a by the MOVPE method using ammonia and trimethylgallium as source gases in accordance with a continuous process using the MOVPE apparatus used in the formation of the buffer layer 102.

Under the conditions that hydrogen (10 slm) is employed as the carrier gas for transporting the material into the growth reactor, the flow rate of ammonia is set to 15 slm, trimethylgallium (TMG) for producing Ga has a V/III ratio of 1,500, and the growth reactor pressure is set to 650 Torr. Under these conditions, the growth rate is set to 7 μm per hour. Since each growth island has the N-polarity along the direction of the layer thickness, epitaxially grown GaN also has the N-polarity along the direction of the layer thickness. Since the growth is performed on the already formed flat growth layer 103a, GaN can be grown keeping a flat surface even if the growth rate is increased.

Note that after the epitaxial growth of GaN is performed to some extent by the above-described MOVPE method, GaN may be epitaxially grown to form the boule 104 by a halide vapor phase epitaxy (HVPE) method using $NH_3$ gas and GaCl gas produced by causing HCl and Ga source gases to react with each other. Note that $GaCl_3$ can be used in place of GaCl to epitaxially grow GaN in more efficient manner. According to the halide vapor phase epitaxy method, since the growth rate is high, the boule 104 having a desired size (thickness) can be formed within a shorter time.

In order to form the boule 104 that is excellent in crystallinity, a substrate having the main surface inclined by 0.4° to 1.2° from the c-plane is used as the growth substrate 101. In particular, the main surface of the growth substrate 101 is inclined from the c-plane using the m-axis as the rotation axis. When such a slightly inclined surface is given as the main surface, the well-known step flow growth is allowed. In the epitaxial growth, a flat surface in which the steps are aligned to allow promotion of the step growth can be obtained, and the boule 104 excellent in crystallinity can be formed. Note that in a-axis rotation, step bunching occurs during the epitaxial growth, thereby increasing the surface roughness.

After the boule 104 is formed as described above, the growth substrate 101 is removed in the sixth step S106, as shown in FIG. 1(f). The growth substrate 101 is removed by, for example, an inner peripheral blade type saw or a wire saw to produce the boule 104 without the substrate. As another method, the back surface of the substrate opposite to GaN may be irradiated with ultraviolet light having the harmonic wavelength of three or four times the wavelength of 1.06 μm of a YAG laser to absorb light in GaN near the substrate, thereby melting GaN and removing the growth substrate. In addition, after the growth substrate is removed by cutting, the resultant structure is lapped and polished, thereby processing the surface of the boule 104 into a mirror surface. After that, in the seventh step S107, as shown in FIG. 1(g), the resultant structure is cut into a desired thickness to produce a plurality of free-standing nitride semiconductor substrates 105. For example, the boule 104 is cut into a disc-like shape to produce a plurality of disc-like crystals. The resultant disc-like crystal is mirror-polished to finish the free-standing nitride semiconductor substrates 105. In the first embodiment, therefore, a free-standing GaN substrate is produced.

As shown above, the main surface is set to the N-polarity to form a boule, and the boule can be formed thicker in compassion with the Ga-polarity. A large number of free-standing nitride semiconductor substrates can be produced from a single boule. Hence, the free-standing nitride semiconductor substrates can be produced at lower cost.

In GaN crystal growth, the main surface is typically set to the Ga-polarity. Under this condition, the area of the main surface becomes small along with the crystal growth. For this reason, in the conventional approach, the final thickness obtained is about 7 to 8 mm at maximum. On the other hand, when the crystal growth of the main surface is performed with the N-polarity, the area of the surface of the grown crystallized layer is equal to or larger than the area of the main surface of the growth substrate. A larger thickness can be obtained without reducing the area of the main surface. This characteristic depends on the crystal habit.

A larger thickness can reduce the defects such as a threading dislocation on the surface side of the substrate. The density of the dislocation generated in the interface between the substrate and GaN due to the lattice mismatch between the substrate and GaN, is reduced with an increase in film thickness. This is because two adjacent threading dislocations form a dislocation loop caused by the distortion existing in the crystal, and further form a single threading dislocation. A threading dislocation density of $10^{8-9}/cm^3$ existing in the interface between GaN and the substrate for the Ga-polarity growth is reduced to $10^{5-6}/cm^3$ with an increase in thickness of 7 to 8 mm. The surface of the free-standing nitride semiconductor substrate can be set in a state with better crystallinity.

Second Embodiment

Figure 2:
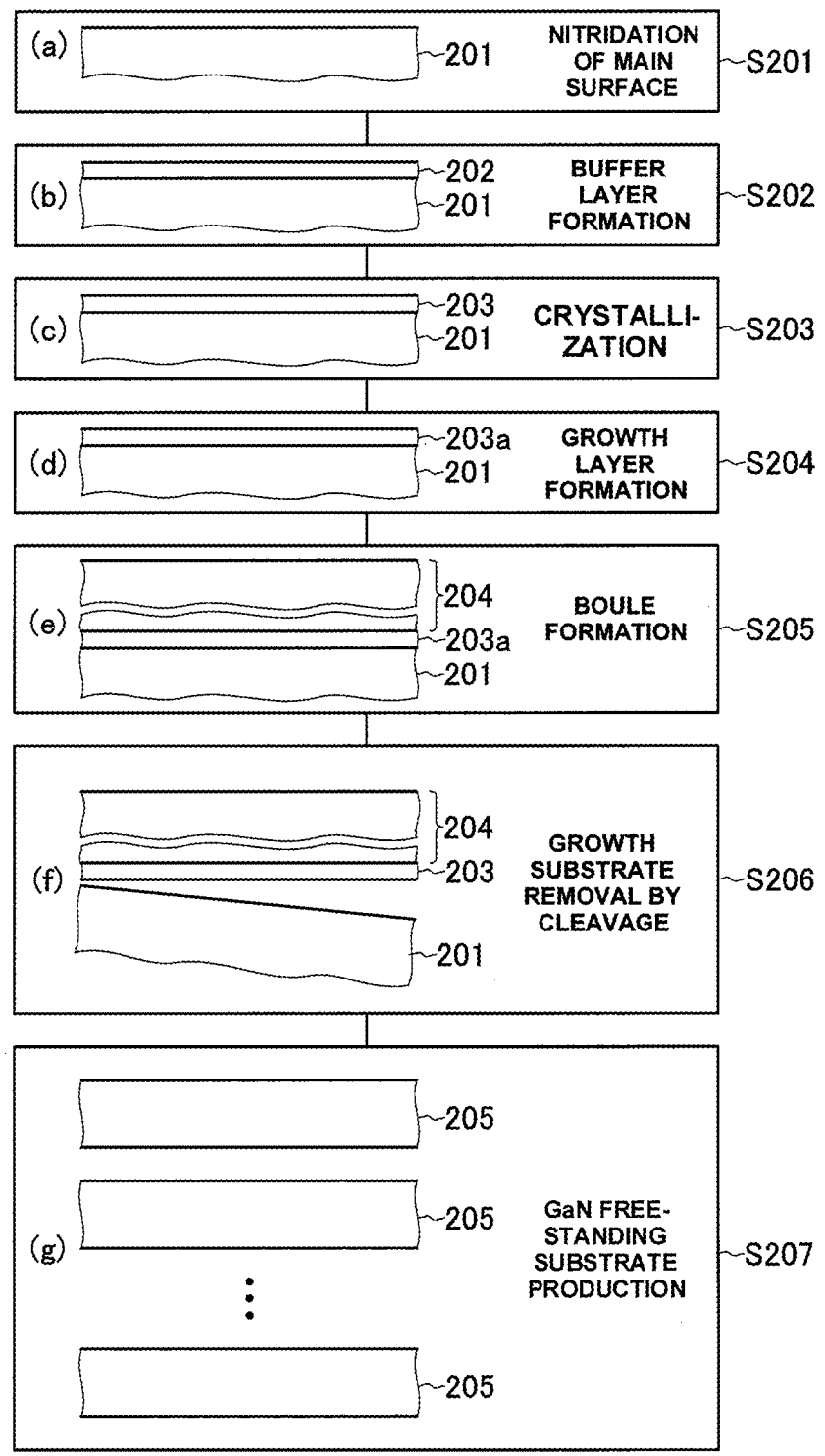
FIG. 2 shows views for explaining a method of producing a free-standing nitride semiconductor substrate according to the second embodiment of the present invention.

The second embodiment of the present invention will then be described with reference to FIG. 2. FIG. 2 shows views for explaining a method of producing a free-standing nitride semiconductor substrate according to the second embodiment of the present invention. In the first embodiment described above, the substrate for the GaN growth is sapphire. The present invention is not limited to this. When a growth substrate is a single-crystalline $ScAlMgO_4$, a free-standing nitride semiconductor substrate can be produced easily in a state with better crystallinity. A method of producing a free-standing nitride semiconductor substrate of the second embodiment using the growth substrate made of the single-crystalline $ScAlMgO_4$ will be described below.

First of all, in the first step S201, as shown in FIG. 2(a), the main surface of a growth substrate 201 made of a single-crystalline $ScAlMgO_4$ is nitrided. In the second step S202, as shown in FIG. 2(b), a buffer layer 202 made of GaN is formed on the main surface of the nitrided growth substrate 201. The buffer layer 202 which is not crystallized under a low-temperature condition of, for example, about 550° C. is formed by the MOVPE method using, for example, ammonia and trimethylgallium as source gases. The buffer layer 202 is formed to a thickness of about 20 nm.

In the third step S203, the buffer layer 202 is heated and converted into a single crystal. As shown in FIG. 2(c), a crystallized layer 203 formed from a plurality of growth islands each of which is a hexagonal platelet with an N-polar upper surface is formed. The buffer layer 202 is heated to a temperature of about 1,050° C. in, for example, the MOVPE apparatus used in the formation of the buffer layer 202. By this heating, some portion of the buffer layer 202 is evaporated (vaporized), and some other portion is crystallized, thereby forming the plurality of growth islands each of which is a hexagonal platelet with an N-polar upper surface. Since the main surface of the growth substrate 201 has already been nitrided, the upper surface of each growth island has the N-polarity.

In the fourth step S204, the growth is then promoted in a direction parallel to the plane of the growth substrate 201 to make the growth islands coalescent. As shown in FIG. 2(d), a continuous growth layer 203a is thus formed.

In the fifth step S205, as shown in FIG. 2(e), the crystal growth of GaN is performed on the growth layer 203a in a state in which the main surface is set to the N-polarity, thereby a boule 204 made of the GaN crystal is formed. The epitaxial growth of GaN is performed using each growth island as a nucleus forming the growth layer 203a by the MOVPE method using ammonia and trimethylgallium as source gases in accordance with a continuous process using the MOVPE apparatus used in the formation of the buffer layer 202. Since the upper surface side of each growth island has the N-polarity, GaN subjected to the epitaxial growth has the growth surface side with the N-polarity.

Note that after the epitaxial growth of GaN is performed to some extent by the above-described MOVPE method, GaN may be epitaxially grown to form the boule 204 by a halide vapor phase epitaxy (HVPE) method using $NH_3$ gas and GaCl gas produced by causing HCl and Ga source gases to react with each other. According to the halide vapor phase epitaxy method that allows the high growth rate, the boule 204 having a desired size (thickness) can be formed within a shorter time. Note that as described above, $GaCl_3$ may be used in place of GaCl.

After the boule 204 is formed as described above, the growth substrate 201 is removed in the sixth step S206, as shown in FIG. 2(f). Since the growth substrate 201 is made of the $ScAlMgO_4$ crystal, almost all the portion of the $ScAlMgO_4$ substrate can be removed by cleavage. The remaining portion may be dissolved and removed by hydrofluoric acid. By removing the growth substrate 201 as described above, the surface of the resultant boule 204 (growth layer 203a) is not damaged by processing and is set in a state in which atomic steps appear. After that, in the seventh step S207, as shown in FIG. 2(g), the boule is cut (divided) into a desired thickness to produce a plurality of free-standing nitride semiconductor substrates 205. For example, the boule 204 is cut into a disc-like shape to produce a plurality of disc-like crystals. The resultant disc-like crystal is mirror-polished to finish the free-standing nitride semiconductor substrates 205. In the second embodiment, therefore, the free-standing GaN substrate is produced.

Third Embodiment

Figure 3:
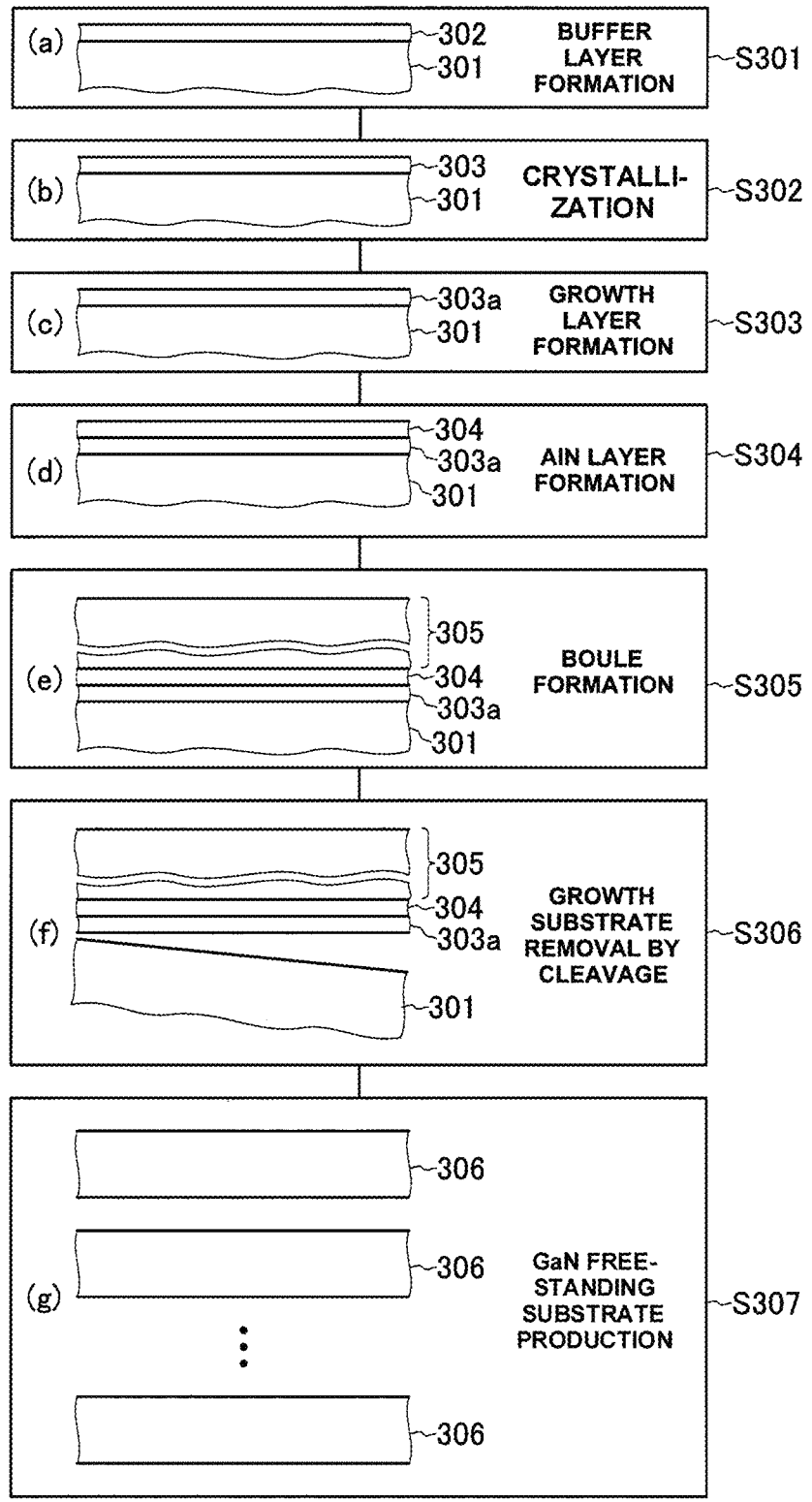
FIG. 3 shows views for explaining a method of producing a free-standing nitride semiconductor substrate according to the third embodiment of the present invention.

A method of producing another free-standing nitride semiconductor substrate according to the third embodiment of the present invention will now be described with reference to FIG. 3. FIG. 3 shows views for explaining a method of producing the free-standing nitride semiconductor substrate according to the third embodiment of the present invention. In the third embodiment as well, a growth substrate made of a single-crystalline $ScAlMgO_4$ is used.

First of all, in the first step S301, as shown in FIG. 3(a), a GaN layer 302 is formed on the main surface of a growth substrate 301 without nitriding the main surface of the growth substrate 301 made of a single-crystalline $ScAlMgO_4$. The buffer layer 302 which is not crystallized is formed by the MOVPE method using, for example, ammonia and trimethylgallium as source gases under a low-temperature condition of, for example, about 550° C. The buffer layer 302 is formed to a thickness of about 20 nm.

In the second step S302, as shown in FIG. 3(b), the buffer layer 302 is heated and converted into a single crystal to form a crystallized layer 303 formed from a plurality of hexagonal growth islands. Thin islands have Ga-polarity along with the direction perpendicular to their upper surfaces. In this crystallization, the buffer layer 302 is heated to a temperature of about 1,050° C. in, for example, the MOVPE reactor used in the formation of the buffer layer 302. By this heating, some portion of the buffer layer 302 is evaporated (vaporized), and some other portion is crystallized, thereby forming the plurality of thin hexagonal growth islands. Since the main surface of the growth substrate 301 is not nitrided, the formed islands have the Ga-polarity along with the direction perpendicular to their upper surfaces.

In the third step S303, the growth is then promoted in a direction parallel to the plane of the growth substrate to make the growth islands coalescent. As shown in FIG. 3(c), a continuous growth layer 303a is thus formed. This layer is Ga-polar.

In the fourth step S304, as shown in FIG. 3(d), an AlN layer 304 with a thickness of about 0.5 µm is grown on the growth layer 303a. For example, the AlN layer can be grown by the MOVPE method. The source materials for the growth are ammonia and trimethylaluminum (TMA) as the aluminum material. The growth temperature is 1,200° C., and the growth reactor pressure is 300 Torr. As a result, the flat AlN layer 304 with the Al polarity (group-III polarity) is formed. The surface of the formed AlN layer 304 is exposed to an oxygen atmosphere to form an oxide layer on the surface. The oxide layer on the surface is then nitrided.

In the fifth step S305, GaN is grown again on the AlN layer 304 whose surface has been oxidized and nitrided. For example, GaN is grown by the MOVPE method. As a result, the crystal growth of a GaN film with the N-polarity is performed. Subsequently, GaN is grown thick by the HVPE method to make it possible to obtain a boule 305, as shown in FIG. 3(e).

After the boule 305 having a desired thickness is formed as described above, the growth substrate 301 is removed in the sixth step S306, as shown in FIG. 3(f). Since the growth substrate 301 is made of the single-crystalline $ScAlMgO_4$, almost all the portion of the growth substrate 301 can be removed by cleavage. The remaining portion may be dissolved and removed by hydrofluoric acid and so on. By removing the growth substrate 301 as described above, the surface of the resultant boule 305 (growth layer 303a) is not damaged by processing and is set in a state in which atomic steps appear. After that, in the seventh step S307, as shown in FIG. 3(g), the boule is cut (divided) into a desired thickness to produce a plurality of free-standing nitride semiconductor substrates 306. For example, the boule 305 is cut into a disc-like shape to produce a plurality of disc-like crystals. The resultant disc-like crystal is mirror-polished to finish the free-standing nitride semiconductor substrates 306.

As shown above, the crystal growth of GaN with N-polarity along the growth direction is performed. The diameter of the GaN crystal increases with the film thickness, and the limitation that the diameter decreases with increasing the thickness in the Ga-polar growth is eliminated. A GaN boule much thicker than the Ga-polar boule can be obtained. This makes it possible to product a free-standing nitride semiconductor substrate at lower cost. In addition, the growth substrate made of the single-crystalline $ScAlMgO_4$ is used to greatly facilitate the removal of the growth substrate as described above.

The lattice mismatch of the single-crystalline $ScAlMgO_4$ to GaN is −1.9 which is smaller than 13.8 of sapphire. For this reason, the dislocation density of the resultant free-standing nitride semiconductor substrate can be reduced. In the growth of all the components by the MOVPE method or some components by the halide vapor phase epitaxy, a lower dislocation density in use of the single-crystalline $ScAlMgO_4$ than that in growth in use of the sapphire substrate can be obtained.

TABLE 1

| Substrate | Metalorganic Vapor Phase Epitaxy | Halide Vapor Phase Epitaxy |
| --- | --- | --- |
| Sapphire | $10^{8-9}/cm^2$ | $10^{5-6}/cm^2$ |
| $ScAlMgO_4$ | $10^{7-8}/cm^2$ | $10^{4-5}/cm^2$ |

As described above, according to the present invention, since the crystal growth of GaN is performed with N-polarity along the growth direction, the boule can be formed to a desired thickness, and the free-standing nitride semiconductor substrate can be produced at lower cost.

Figure 4:
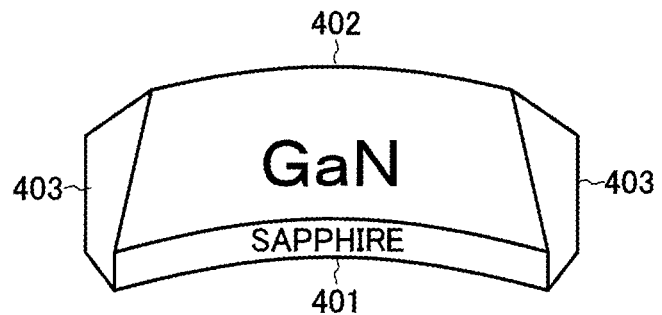
FIG. 4 is a view for explaining a problem when the crystal growth of GaN is performed in a state in which a main surface is set to Ga-polarity.
Figure 5:
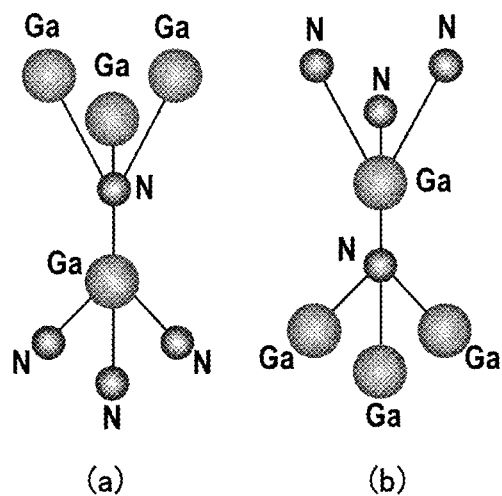
FIG. 5 shows views for explaining the polarities on the surface of the GaN substrate.
Figure 6:
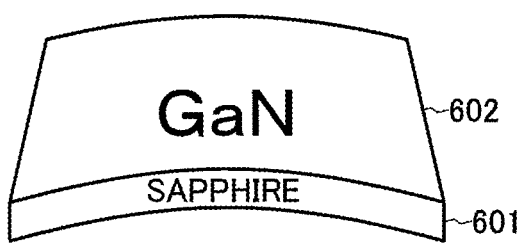
FIG. 6 is a view for explaining a state after a thick-film GaN growth for a free-standing nitride semiconductor substrate is produced with the Ga-polarity.

In the crystal growth with Ga-polarity along the growth direction, as shown in FIG. 4, the concomitant growth portions 403 are formed on the side portions of a GaN film 402 obtained by the epitaxial growth on a substrate 401. A tensile stress acts on each concomitant growth portion 403. As a result, the dislocation tends to occur in the GaN film 402 during the epitaxial growth. In addition, an atomic vacancy is also likely to be formed. The dislocation and vacancy act as crystal defects to degrade the properties of the epitaxial growth layer. Conversely, when the crystal growth of GaN is performed with N-polarity along the growth direction, the above concomitant growth portion is rarely formed. As a result, a high-quality boule can be obtained.

When a growth substrate is made of a single-crystalline $ScAlMgO_4$, a free-standing nitride semiconductor substrate can easily be produced at lower cost. In addition, for example, it is possible to obtain a GaN boule at a thickness of 20 cm. In this case, the threading dislocation density can be set to $10^3/cm^2$. This value is almost equal to that of GaAs or InP used for conventional devices and is effective to increase the device lifetime.

When a growth substrate is made of the single-crystalline $ScAlMgO_4$, the dislocation density of the resultant free-standing nitride semiconductor substrate can be reduced. By using a free-standing nitride semiconductor substrate with a lower dislocation density, the production of a laser diode with a long device-lifetime and a light-emitting diode with high luminance, the improvement of the luminous efficiency in a light emitting diode in the wavelength region of ultraviolet, and a transistor with a higher output power and a transistor with a higher output can be implemented.

The present invention is not limited to the embodiments described above. It is obvious that many modifications and combinations can be practiced by those who have ordinary knowledge in this technical field within the technical concept of the present invention.

For example, an AlN, InGaN, or InN free-standing substrate can be produced by the same method as described above. In particular, if a growth substrate made of the single-crystalline $ScAlMgO_4$ is used, InGaN is suitable because the lattice constant difference from $ScAlMgO_4$ is the minimum.

Note that in the production of an AlN free-standing substrate, under the condition in which the main surface of a growth substrate made of the single-crystalline $ScAlMgO_4$ is not nitrided, after a growth layer is formed, the surface of the AlN growth layer is oxidized without forming a new AlN layer, the surface is then nitrided, AlN is grown by the MOVPE method, and an AlN boule is formed.

EXPLANATION OF THE REFERENCE NUMERALS AND SIGNS

101 . . . growth substrate, 102 . . . buffer layer, 103 . . . crystallized layer, 103*a* . . . growth layer, 104 . . . boule, 105 . . . free-standing nitride semiconductor substrate

The invention claimed is:

1. A method of producing a free-standing nitride semiconductor substrate, comprising: a first step of forming a buffer layer of a nitride semiconductor that is one of GaN, AlN, InGaN, and InN on a main surface of a single crystalline substrate;
   a second step of forming a crystallized layer including a plurality of growth islands each of which is a hexagonal platelet with an N-polar upper surface, by annealing the buffer layer and thereby converting the buffer layer into a single crystal;
   a third step of fabricating a continuous layer including the plurality of growth islands by promoting the lateral growth of the plurality of growth islands along the main surface of the single crystalline substrate and thereby performing coalescence of the plurality of growth islands;
   a fourth step of forming a boule of the nitride semiconductor on the continuous layer by performing the crystal growth of the nitride semiconductor with an N-polar upper surface on the continuous layer;
   a fifth step of removing the single crystalline substrate from the boule; and
   a sixth step of fabricating a plurality of free-standing nitride semiconductor substrates by cutting the boule,
   wherein the single crystalline substrate is made of a single crystalline $ScAlMgO_4$,
   wherein
   the nitride semiconductor is one of GaN, InGaN, and InN, and
   the fourth step includes steps of (a) forming an AlN layer on the continuous layer, (b) oxidizing a surface of the AlN layer, (c) nitriding the surface of the AlN layer which has been oxidized, and (d) performing the crystal growth of the nitride semiconductor with an N-polar upper surface on the AlN layer.

2. A method of producing a free-standing nitride semiconductor substrate, comprising: a first step of forming a buffer layer of a nitride semiconductor that is one of GaN, AlN, InGaN, and InN on a main surface of a single crystalline substrate;
   a second step of forming a crystallized layer including a plurality of growth islands each of which is a hexagonal platelet with an N-polar upper surface, by annealing the buffer layer and thereby converting the buffer layer into a single crystal;
   a third step of fabricating a continuous layer including the plurality of growth islands by promoting the lateral growth of the plurality of growth islands along the main surface of the single crystalline substrate and thereby performing coalescence of the plurality of growth islands;
   a fourth step of forming a boule of the nitride semiconductor on the continuous layer by performing the crystal growth of the nitride semiconductor with an N-polar upper surface on the continuous layer;
   a fifth step of removing the single crystalline substrate from the boule; and
   a sixth step of fabricating a plurality of free-standing nitride semiconductor substrates by cutting the boule,
   wherein the single crystalline substrate is made of a single crystalline $ScAlMgO_4$,
   wherein
   the nitride semiconductor is AlN, and
   the fourth step includes steps of (a) oxidizing a surface of the continuous layer, (b) nitriding the surface of the continuous layer that has been oxidized, and (c) performing the crystal growth of the nitride semiconductor with an N-polar upper surface on the continuous layer.

3. The method of producing a free-standing nitride semiconductor substrate according to claim 1, wherein the main surface of the single crystalline substrate is rotated by 0.4° to 1.2° around the m-axis thereof.

4. The method of producing a free-standing nitride semiconductor substrate according to claim 2, wherein the main surface of the single crystalline substrate is rotated by 0.4° to 1.2° around the m-axis thereof.

* * * * *